(12) United States Patent
Hwang

(10) Patent No.: US 11,170,827 B2
(45) Date of Patent: Nov. 9, 2021

(54) DATA BUFFER AND MEMORY DEVICE HAVING THE SAME

(71) Applicant: SK hynix Inc., Gyeonggi-do (KR)

(72) Inventor: Jin Ha Hwang, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 17/093,745

(22) Filed: Nov. 10, 2020

(65) Prior Publication Data

US 2021/0057004 A1  Feb. 25, 2021

Related U.S. Application Data

(62) Division of application No. 16/161,272, filed on Oct. 16, 2018, now Pat. No. 10,867,640.

(30) Foreign Application Priority Data

Mar. 2, 2018  (KR) .................. 10-2018-0025366

(51) Int. Cl.
*G11C 16/26* (2006.01)
*G11C 7/10* (2006.01)
*G11C 7/06* (2006.01)

(52) U.S. Cl.
CPC .............. *G11C 7/1051* (2013.01); *G11C 7/06* (2013.01); *G11C 7/1084* (2013.01); *G11C 16/26* (2013.01)

(58) Field of Classification Search
CPC ........................................ G11C 16/26
USPC .................................. 365/189.011
See application file for complete search history.

(56) References Cited

U.S. PATENT DOCUMENTS

| | | | | |
|---|---|---|---|---|
| 2007/0115710 A1* | 5/2007 | Kim | ............... | G11C 11/417 365/63 |
| 2008/0019196 A1* | 1/2008 | Lin | ............... | G11C 7/1051 365/193 |
| 2012/0250440 A1* | 10/2012 | Wu | ............... | G11C 7/065 365/203 |
| 2014/0149618 A1* | 5/2014 | Venkatesan | ......... | G06F 13/1668 710/110 |
| 2014/0153344 A1* | 6/2014 | Kim | ............... | G11C 5/147 365/189.09 |

* cited by examiner

*Primary Examiner* — Muna A Techane
(74) *Attorney, Agent, or Firm* — IP & T Group LLP

(57) ABSTRACT

There are provided a data buffer and a memory system having the same. The data buffer includes first and second amplifiers configured to output output data by inverting input data, the first and second amplifiers having coupled output nodes to which the output data is output, wherein both of the first and second amplifiers are activated to output the output data when the input data has a first swing level, and wherein one of the first and second amplifiers is activated to output the output data when the input data has a second swing level narrower than the first swing level.

15 Claims, 8 Drawing Sheets

DATA BUFFER AND MEMORY DEVICE HAVING THE SAME

CROSS-REFERENCE TO RELATED APPLICATION

This application is a division of U.S. patent application Ser. No. 16/161,272 filed on Oct. 16, 2018, which claims benefits of priority of Korean Patent Application No. 10-2018-0025366 filed on Mar. 2, 2018. The disclosure of each of the foregoing application is incorporated herein by reference in its entirety.

BACKGROUND

1. Field of Invention

The present disclosure generally relates to a data buffer and a memory device having the same.

2. Description of Related Art

A memory device may store or output data. Generally, there are two types of memory devices: a volatile memory device in which stored data is extinguished when the power is shut off or interrupted, and a nonvolatile memory device in which stored data is retained even when power is shut off or interrupted. The memory device may include a memory cell array for storing data, a peripheral circuit for performing various operations such as program, read, and erase operations, and a control logic for controlling the peripheral circuit.

A memory controller may control data communication between a host and the memory device.

The memory device may communicate with the memory controller through a channel. For example, a data buffer in the peripheral circuit in the memory device may transmit and receive data between the memory controller and the memory device through the channel.

SUMMARY

Embodiments provide a data buffer capable of selectively transmitting data having various swing levels in various modes and a memory device having the data buffer.

According to an aspect of the present disclosure, there is provided a data buffer including first and second amplifiers configured to output output data by inverting input data, the first and second amplifiers having coupled output nodes to which the output data is output, wherein both of the first and second amplifiers are activated to output the output data when the input data has a first swing level, and wherein one of the first and second amplifiers is activated to output the output data when the input data has a second swing level narrower than the first swing level.

According to another aspect of the present disclosure, there is provided a data buffer including: a first amplifier configured to output data obtained by inverting input data in a first mode, the first amplifier configured to output data that is of a low level to an output node based on the input data in a second mode in which a swing level of data is different from that of data in the first mode; and a second amplifier configured to output data obtained by inverting the input data together with the first amplifier in the first mode, the second amplifier configured to output data that is of a high level to the output node based on the input data in the second mode.

According to still another aspect of the present disclosure, there is provided a memory device including: a memory cell array configured to store data; a peripheral circuit configured to perform various operations of the memory cell array; and control logic configured to control the peripheral circuit, based on a command, an address, and input data, which are received through a channel, wherein the peripheral circuit includes a data buffer configured to transfer, within the peripheral circuit, data generated in different modes according to swing levels of the input data received through the channel.

According to still another aspect of the present disclosure, there is provided a data buffer comprising: a first amplifier coupled to an output node, the first amplifier configured to receive data, invert the data and output the inverted data to the output node; a second amplifier coupled to the output node, the second amplifier configured to receive the data, invert the data and output the inverted data to the output node; and wherein both of the first and second amplifiers simultaneously output the inverted data having a high level and a low level when the data has a first swing level, and wherein one of the first and second amplifiers outputs the output data having a high level and the other of the first and second amplifiers outputs the output data having a low level when the input data has a second swing level lower than the first swing level.

BRIEF DESCRIPTION OF THE DRAWINGS

Various embodiments will now be described more fully with reference to the accompanying drawings; however, elements and features of the present disclosure may be configured or arranged differently than shown or described herein. Thus, the present invention is not limited to the embodiments set forth herein. Rather, these embodiments are provided so that this disclosure is thorough and complete and fully conveys the scope of the embodiments to those skilled in the art.

In the drawing figures, dimensions may be exaggerated to more clearly illustrate certain features or relationships. It will be understood that when an element is referred to as being "between" two elements, it can be the only element between the two elements, or one or more intervening elements may also be present. Like reference numerals refer to like elements throughout. Also, throughout the specification, reference to "an embodiment" or the like is not necessarily to only one embodiment, and different references to "an embodiment" are not necessarily to the same embodiment(s).

DETAILED DESCRIPTION

In the following detailed description, various embodiments of the present disclosure have been shown and described, simply by way of example. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include one or more other components rather than excluding such other component(s), unless the context indicates otherwise.

Figure 1:
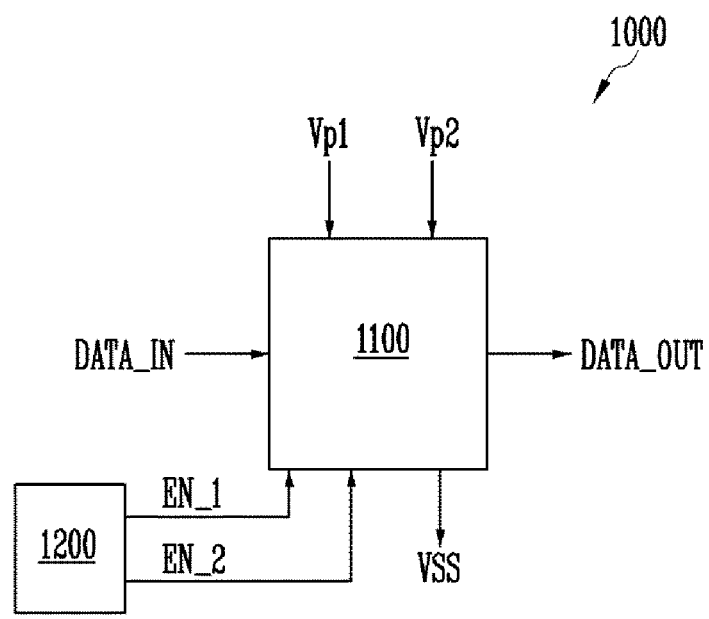
FIG. 1 is a diagram illustrating a data buffer according to an embodiment of the present disclosure.

FIG. 1 is a diagram illustrating a data buffer 1000 according to an embodiment of the present disclosure.

Referring to FIG. 1, the data buffer 1000 may include a data transmission circuit 1100 and a mode switching circuit 1200.

The data transmission circuit 1100 may be supplied with a first voltage Vp1 supplied at a first voltage terminal and a second voltage Vp2 supplied at a second voltage terminal, and be coupled to a ground voltage terminal at which a ground voltage VSS is supplied. The data transmission circuit 1100 may receive an input data DATA_IN and output output data DATA_OUT in response to a first enable signal EN_1 or a second enable signal EN_2.

The mode switching circuit 1200 may output the first enable signal EN_1 or the second enable signal EN_2 depending on a mode of an electronic device (e.g., a memory device) including the data buffer 1000. The mode switching circuit 1200 typically does not simultaneously activate and output the first and second enable signals EN_1 and EN_2. The first and second enable signals EN_1 and EN_2 may be output depending on a swing level of the input data DATA_IN. The data transmission circuit 110 may operate in a particular mode depending on the first or second enable signal EN_1 or EN_2.

When the input data DATA_IN has a first swing level, the mode switching circuit 1200 may output the first enable signal EN_1. At this time, the second enable signal EN_2 may be inactivated.

Figure 2:
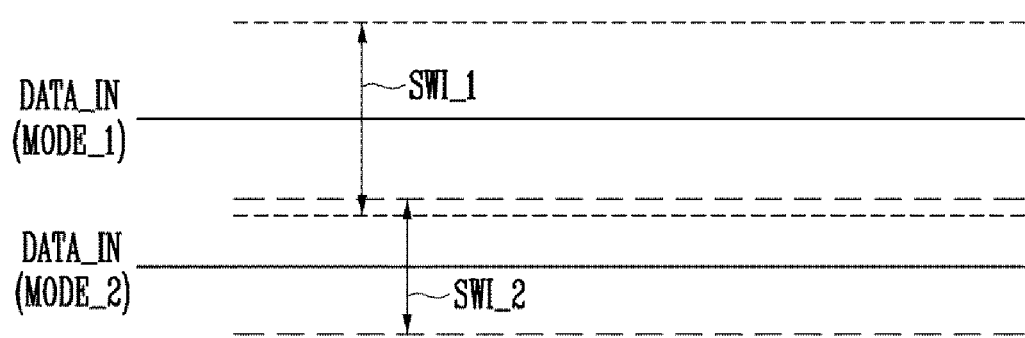
FIG. 2 is a diagram illustrating data modes in which swing levels of data are different from each other, according to an embodiment of the present disclosure.

FIG. 2 is a diagram illustrating data modes in which swing levels of data are different from each other according to an embodiment of the present disclosure.

Referring to FIG. 2, as an example, the input data DATA_IN has a first swing level SWI_1 in a first mode MODE_1, and the input data DATA_IN has a second swing level SWI_2 in a second mode MODE_2, different from the first mode MODE_1. The term "swing level" may refer to the range of values that the data or signal may adopt in operation, or the difference between the highest and lowest values of the data or signal. The first swing level SWI_1 may be wider, or have a greater range, than the second swing level SWI_2. An average voltage of the input data DATA_IN used in the first mode MODE_1 may be higher or greater than that of the input data DATA_IN used in the second mode MODE_2. For example, the first mode MODE_1 may be a voltage of 1.8V, and the second mode MODE_2 may be a complementary metal-oxide semiconductor (CMOS) voltage (i.e., 1.5V).

Figure 3:
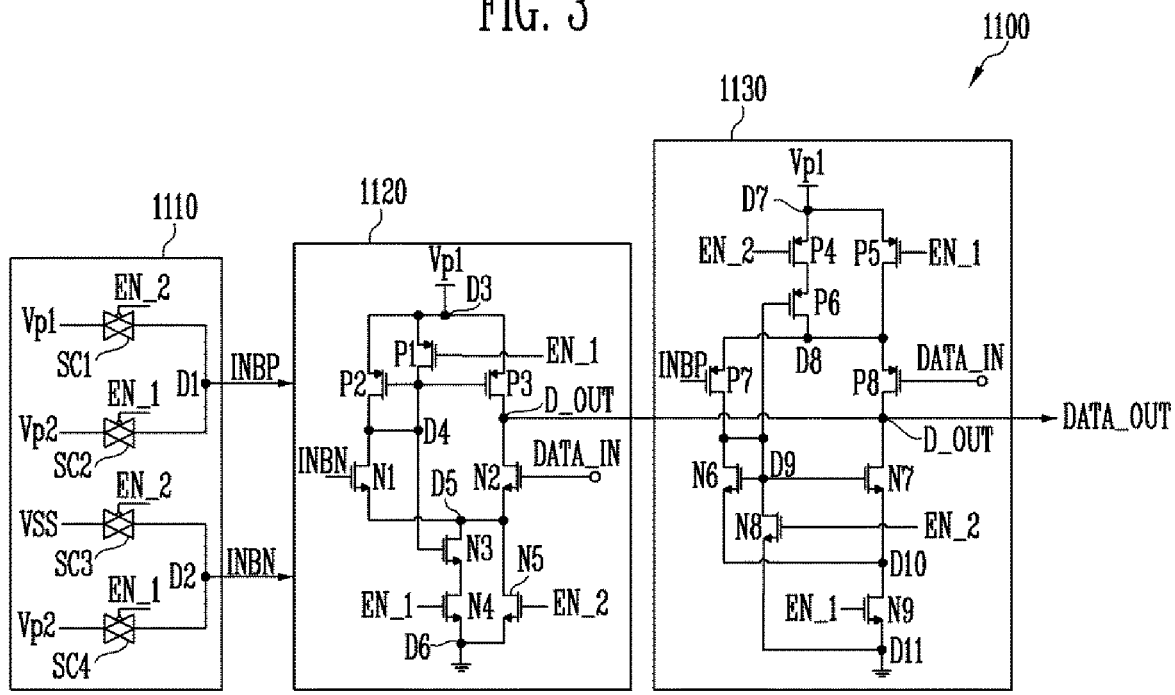
FIG. 3 is a circuit diagram illustrating a data transmission circuit according to an embodiment of the present disclosure.

FIG. 3 is a circuit diagram illustrating a data transmission circuit 1100 according to an embodiment of the present disclosure, for example, the data transmission circuit 1100 of FIG. 1.

Referring to FIG. 3, the data transmission circuit 1100 may include a voltage selection circuit 1110, a first amplifier 1120, and a second amplifier 1130.

The voltage selection circuit 1110 may be supplied with the first and second voltages Vp1 and Vp2, and be coupled to the ground voltage terminal. The voltage selection circuit 1110 may be implemented with a multiplexer using the first voltage Vp1, the ground voltage VSS and the second voltage Vp2 in response to the first or second enable signal EN_1 or EN_2. For example, the voltage selection circuit 1110 may output the second voltage Vp2 as first and second internal voltages INBP and INBN in response to the first enable signal EN_1. The voltage selection circuit 1110 may output and use the first voltage Vp1 and the ground voltage VSS respectively as the first internal voltage INBP and the second internal voltage INBN in response to the second enable signal EN_2. The voltage selection circuit 1110 may include a first switch SC1 for transferring the first voltage Vp1 to a first node D1 in response to the second enable signal EN_2 and a second switch SC2 for transferring the second voltage Vp2 to the first node D1 in response to the first enable signal EN_1. Also, the voltage selection circuit 1110 may include a third switch SC3 for transferring the ground voltage VSS to a second node D2 in response to the second enable signal EN_2 and a fourth switch SC4 for transferring the second voltage Vp2 to the second node D2 in response to the first enable signal EN_1.

The first amplifier 1120 and the second amplifier 1130 may commonly receive the input data DATA_IN, and output the output data DATA_OUT in response to the first or second enable signal EN_1 or EN_2.

The first amplifier 1120 may include first to third PMOS transistors P1 to P3 and first to fifth NMOS transistors N1 to N5, which are coupled between a third node D3 to which the first voltage Vp1 is applied and a sixth node D6 that is a ground terminal.

The first PMOS transistor P1 may couple the third node D3 and a fourth node D4 to each other in response to the first enable signal EN_1. Gates of the second and third PMOS transistors P2 and P3 may be commonly coupled to the fourth node D4. For example, the second PMOS transistor P2 may couple the third node D3 and the fourth node D4 to each other according to a voltage of the fourth node D4. The third PMOS transistor P3 may couple the third node D3 and an output node D_OUT to each other according to the voltage of the fourth node D4.

The first NMOS transistor N1 may couple the fourth node D4 and a fifth node D5 to each other according to the second internal voltage INBN. The second NMOS transistor N2 may couple the output node D_OUT and the fifth node D5 to each other according to the input data DATA_IN. The third and fourth NMOS transistors N3 and N4 may be coupled in series to each other between the fifth node D5 and the sixth node D6. For example, the third NMOS transistor N3 may couple the fifth node D5 and the fourth NMOS transistor N4 to each other according to the voltage of the fourth node D4, and the fourth NMOS transistor N4 may couple the third NMOS transistor N3 and the sixth node D6 to each other according to the first enable signal EN_1. The fifth NMOS transistor N5 may couple the fifth node D5 and the sixth node D6 to each other according to the second enable signal EN_2.

The first PMOS transistor P1 may be turned off when the first enable signal EN_1 is high (i.e., at a high level), and be turned on when the first enable signal EN_1 is low (i.e., at a low level). The first NMOS transistor N1 may be turned on when the second internal voltage INBN is high, and be turned off when the second internal voltage INBN is low. The second NMOS transistor N2 may be turned on when the input data DATA_IN is high, and be turned off when the input data DATA_IN is low. The fourth NMOS transistor N4 may be turned on when the first enable signal EN_1 is high, and be turned off when the first enable signal EN_1 is low. The fifth NMOS transistor N5 may be turned on when the second enable signal EN_2 is high, and be turned off when the second enable signal EN_2 is low.

The second amplifier 1130 may include fourth to eighth PMOS transistors P4 to P8 and sixth to ninth NMOS transistor N6 to N9, which are coupled between a seventh node D7 to which the first voltage Vp1 is applied and an eleventh node D11 that is a ground terminal.

The fourth and sixth PMOS transistors P4 and P6 may be coupled in series to each other between the seventh node D7 and an eighth node D8. For example, the fourth PMOS transistor P4 may couple the seventh node D7 and the sixth PMOS transistor P6 to each other according to the second enable signal EN_2. The sixth PMOS transistor P6 may couple the fourth PMOS transistor P4 and the eighth node D8 to each other according to a voltage of a ninth node D9. The fifth PMOS transistor P5 may couple the seventh node D7 and the eighth node D8 to each other according to the first enable signal EN_1. The seventh PMOS transistor P7 may couple the eighth node D8 and the ninth node D9 to each other according to the first internal voltage INBP. The eighth PMOS transistor P8 may couple the eighth node D8 and an output node D_OUT.

The sixth NMOS transistor N6 may couple the ninth node D9 and a tenth node D10 to each other according to the voltage of the ninth node D9. The seventh NMOS transistor N7 may couple the output node D_OUT and the tenth node D10 to each other according to the voltage of the ninth node D9. The eighth NMOS transistor N8 may couple the ninth node D9 and the eleventh node D11 to each other according to the second enable signal EN_2. The ninth NMOS transistor may couple the tenth node D10 and the eleventh node D11 to each other according to the first enable signal EN_1.

The fourth PMOS transistor P4 may be turned off when the second enable signal EN_2 is high, and be turned on when the second enable signal EN_2 is low. The fifth PMOS transistor P5 may be turned off when the first enable signal EN_1 is high, and be turned on when the first enable signal EN_1 is low. The seventh PMOS transistor P7 may be turned off when the first internal voltage INBP is high, and be turned on when the first internal voltage INBP is low. The eighth PMOS transistor P8 may be turned off when the input data DATA_IN is high, and be turned on when the input data DATA_IN is low. The eighth NMOS transistor N8 may be turned on when the second enable signal EN_2 is high, and be turned off when the second enable signal EN_2 is low. The ninth NMOS transistor N9 may be turned on when the first enable signal EN_1 is high, and be turned off when the first enable signal EN_1 is low.

An operating method of the data transmission circuit 1100 will be described as follows.

Figure 4:
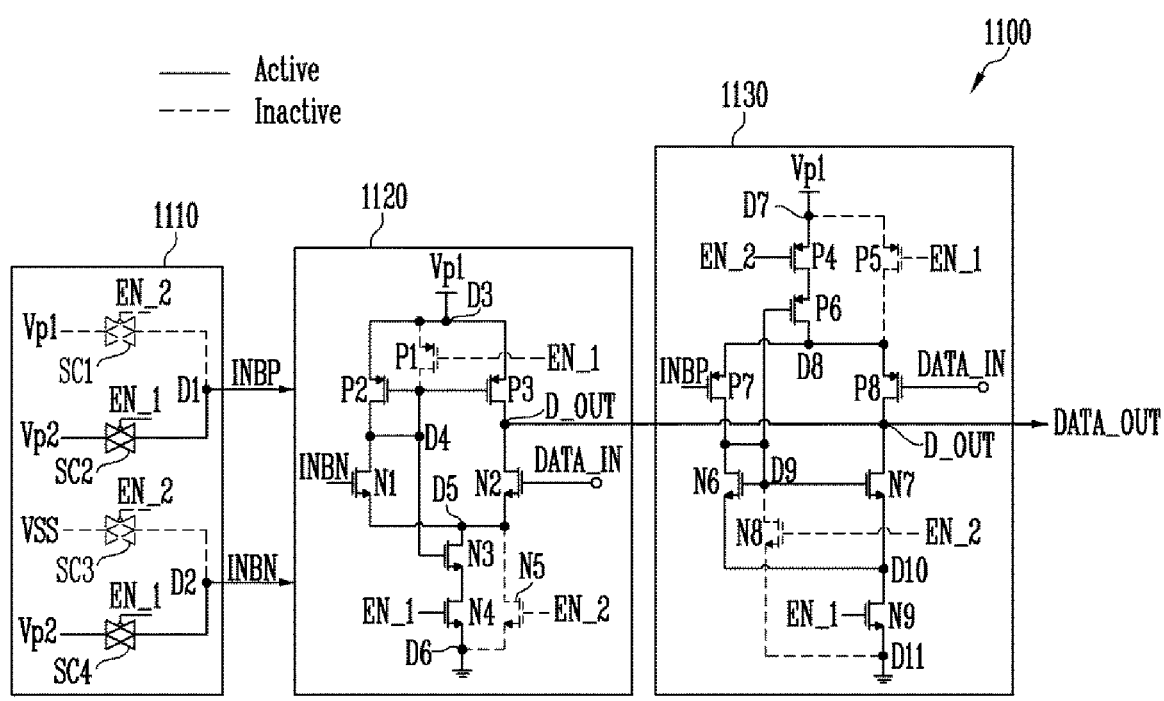
FIG. 4 is a diagram illustrating a driving method of a data transmission circuit in a first mode according to an embodiment of the present disclosure.

FIG. 4 is a diagram illustrating a driving method of the data transmission circuit 1100 of FIG. 3 in the first mode according to an embodiment of the present disclosure.

Referring to FIG. 4, in the first mode, the first enable signal EN_1 is activated and the second enable signal EN_2 is inactivated. That a signal is activated means that a logic level of the signal is high, and that a transistor is activated means that the transistor is turned on. That a signal is inactivated means that a logic level of the signal is low, and that a transistor is inactivated means that the transistor is turned off. In FIG. 4, transistors indicated by a dotted line may be turned off when the first mode is executed, whereas transistors indicated by a solid line may be turned on or turned off according to a voltage applied to gates thereof. That is, in the first mode, the PMOS transistors and the NMOS transistors may be turned on or turned off according to the activated first enable signal EN_1 and the inactivated second enable signal EN_2. This is described in detail below.

In the voltage selection circuit 1110, the second and fourth switches SC2 and SC4 are turned on according to the first enable signal EN_1 that is high, and therefore, the second voltage Vp2 is output as the first and second internal voltages INBP and INBN. The second voltage Vp2 may be a positive voltage that is higher than 0V and is lower than the first voltage Vp1.

In the first amplifier 1120, the first PMOS transistor P1 may be turned off according to the first enable signal EN_1 that is high. The fourth node D4 may be initially reset to low. Therefore, the second and third PMOS transistors P2 and P3 may be turned on. If the second and third PMOS transistors P2 and P3 are turned on, the third node D3, the fourth node D4, and the output node D_OUT may be coupled to each other. The first voltage Vp1 that is a positive voltage is supplied to the third node D3, and therefore, the positive voltage may also be applied to the fourth node D4 and the output node D_OUT. When the voltage of the fourth node D4 is increased, the third NMOS transistor N3 may be turned on. The fourth NMOS transistor N4 is turned on by the first enable signal EN_1 that is high, and the fifth NMOS transistor N5 is turned off by the second enable signal EN_2 that is low. Therefore, the fifth node D5 may be coupled to the sixth node D6 coupled to the ground terminal. In addition, the second internal voltage INBN having the second voltage Vp2 that is a positive voltage is applied to the first NMOS transistor N1, and therefore, a current path passing through the fourth to sixth nodes D4 to D6 may be formed.

In the second amplifier 1130, the fourth POMS transistor P4 may be turned on according to the second enable signal EN_2 that is low. When the ninth node D9 is initialized to a low level, the sixth PMOS transistor P6 is turned on, and therefore, the eighth node D8 may be coupled to the seventh node D7. The first voltage Vp1 that is a positive voltage is applied to the seventh node D7, and therefore, the positive voltage may also be applied to the eighth node D8. The fifth PMOS transistor P5 may be turned off according to the first enable signal EN_1 that is high. The seventh PMOS transistor P7 may be slightly turned on according to the first internal voltage INBP having the second voltage Vp2, and therefore, the eighth node D8 and the ninth node D9 may be coupled to each other. Thus, when the voltage of the ninth node D9 is increased, the sixth and seventh NMOS transistors N6 and N7 are turned on. The ninth NMOS transistor N9 is turned on according to the first enable signal EN_1 that is high, and therefore, a current path may be formed between the output node D_OUT and the ground terminal through the tenth node D10 and the eleventh node D11.

When the input data DATA_IN swings to a high level, the second NMOS transistor N2 is turned on in the first amplifier 1120. Thus, a current path passing through the output node D_OUT, the fifth node D5, and the sixth node D6 may be formed such that data of a low level is output. In the second amplifier 1130, the eighth PMOS transistor P8 is turned off, and the output node D_OUT is coupled to the ground terminal. Therefore, data of a low level may be output through the output node D_OUT. That is, output data that fully swings to a low level may be output in the first and second amplifiers 1120 and 1130.

When the input data DATA_IN swings to a low level, in the first amplifier 1120, the second NMOS transistor N2 is turned off, and the first voltage Vp1 is transmitted to the output node D_OUT through the third PMOS transistor P3. Therefore, data of a high level may be output. In the second amplifier 1130, the eighth PMOS transistor P8 is turned on, and therefore, a current path passing through the eighth node D8, the output node D_OUT, and the tenth and eleventh nodes D10 and D11 may be formed such that the voltage of the eighth node D8 is decreased. Thus, the eighth node D8 and the ninth node D9 are coupled to each other through the seventh PMOS transistor P7, and therefore, the voltage of the ninth node D9 may be decreased. Accordingly, the sixth PMOS transistor P6 is turned on, and thus the first voltage Vp1 is transmitted to the output node D_OUT such that output data that fully swings to a high level may be output.

Figure 5:
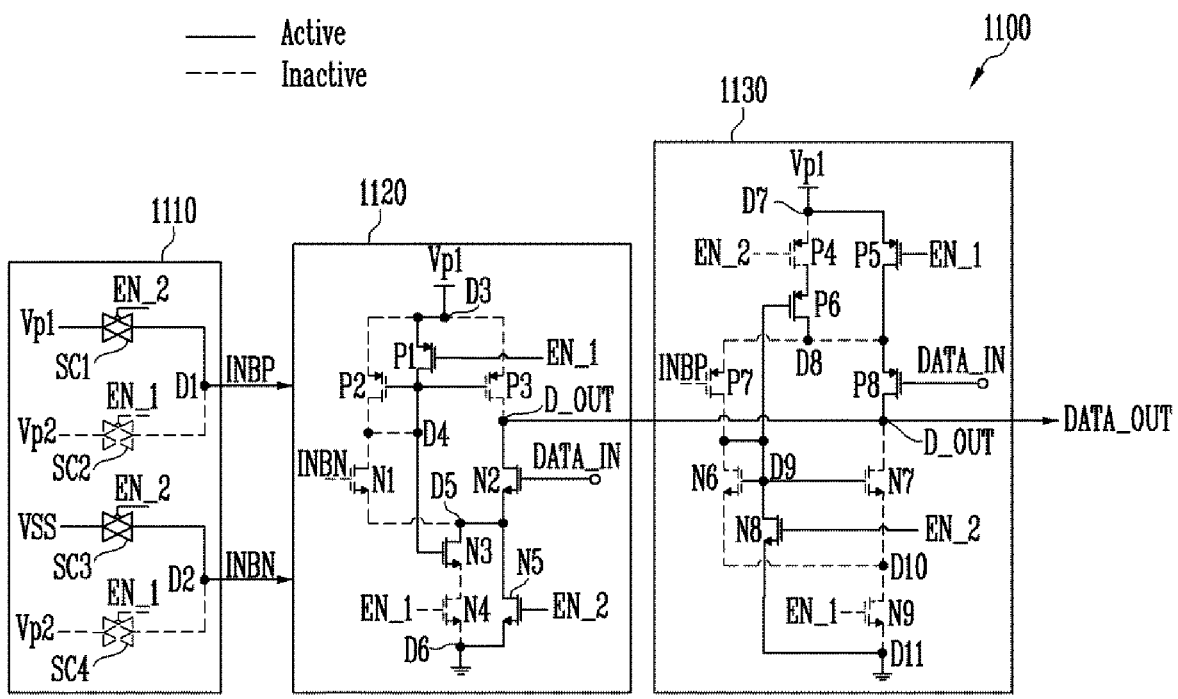
FIG. 5 is a diagram illustrating a driving method of a data transmission circuit in a second mode according to an embodiment of the present disclosure.

FIG. 5 is a diagram illustrating a driving method of the data transmission circuit 1100 of FIG. 3 in the second mode according to an embodiment of the present disclosure.

Referring to FIG. 5, in the second mode, the first enable signal EN_1 is inactivated and the second enable signal EN_2 is activated. Like FIG. 4, in FIG. 5, transistors indicated by a dotted line may be turned off when the second mode is executed, whereas transistors indicated by a solid line may be turned on or turned off according to a voltage applied to gates thereof.

That is, in the second mode, the PMOS transistors and the NMOS transistors may be turned on or turned off according to the activated second enable signal EN_2 and the inactivated first enable signal EN_1. This is described in detail below.

In the voltage selection circuit 1100, the first and third switches SC1 and SC3 are turned on according to the second enable signal EN_2 that is high. Therefore, the first voltage Vp1 may be output as the first internal voltage INBP, and the ground voltage VSS may be output as the second internal voltage INBN.

In the first amplifier 1120, the first PMOS transistor P1 may be turned on according to the first enable signal EN_1 that is low. Thus, the fourth node D4 may be coupled to third node D3 to which the first voltage Vp1 is supplied, and therefore, the third NMOS transistor N3 may be turned on.

Since the voltage of the fourth node D4 is increased to a high level, the second and third PMOS transistors P2 and P3 may be turned off. Therefore, in the first amplifier 1120, the first voltage Vp1 is not transmitted to the output node D_OUT. Accordingly, in the second mode, data of high level cannot be output through the first amplifier 1120. The fifth NMOS transistor N5 is turned on according to the second enable signal EN_2 that is high, and therefore, the output node D_OUT may be coupled to the ground terminal through the fifth node D5 and the sixth node D6 according to the input data DATA_IN.

In the second amplifier 1130, the fourth PMOS transistor P4 may be turned off according to the second enable signal EN_2 that is high, and the fifth PMOS transistor P5 may be turned on according to the first enable signal EN_1 that is low. Accordingly, the first voltage Vp1 is transmitted to the eighth node D8 through the fifth PMOS transistor P5.

Therefore, the eighth node D8 and the output node D_OUT may be coupled to or blocked from each other according to the input data DATA_IN. The eighth NMOS transistor N8 is turned on by the second enable signal EN_2 that is high, and therefore, the ninth node D9 may be coupled to the ground terminal. Thus, the sixth and seventh NMOS transistors N6 and N7 are turned off. In particular, the seventh NMOS transistor N7 is turned off, and thus the output node D_OUT is not coupled to the ground terminal. As described above, the data transmission circuit 1100 may be used as a tristate inverter due to the transistors turned off in the second mode.

When the input data DATA_IN swings to a high level, the second NMOS transistor N2 is turned on in the first amplifier 1120, and therefore, a current path passing through the output node D_OUT, the fifth node D5, and the sixth node D6 may be formed such that data of a low level is output. In the second amplifier 1130, both of the eighth PMOS transistor P8 and the seventh PMOS transistor P7 are turned off, and thus the voltage of the output node D_OUT is not influenced.

When the input data DATA_IN swings to a low level, both of the second NMOS transistor N2 and the third PMOS transistor P3 are turned off in the first amplifier 1120, and thus the voltage of the output node D_OUT is not influenced. In the second amplifier 1130, the seventh NMOS transistor N7 is turned off, and both of the fifth and eighth PMOS transistors P5 and P8 are turned on. Therefore, high level data may be output.

That is, in the first mode in which the swing level of data is relatively wide, both of the first and second amplifiers 1120 and 1130 simultaneously output high and low level data, and therefore, full-swing data may be output. On the other hand, in the second mode in which the swing level of data is relatively narrow, low level data is output from only the first amplifier 1120 and high level data is output from only the second amplifier 1130. Therefore, current consumption may be lowered.

Thus, modes in which swing levels of data are different from each other may be selectively driven using one data buffer 1000.

The data transmission circuit 1100 described above may be used in various electronic systems. In an embodiment, an example in which the data transmission circuit 1100 is used in a memory system for storing data will be described.

Figure 6:
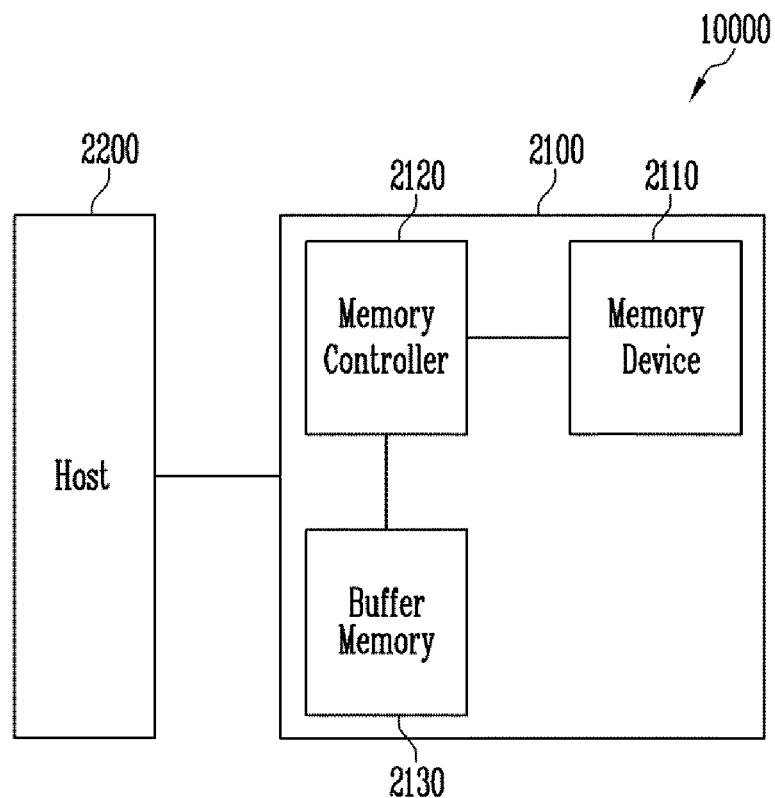
FIG. 6 is a diagram illustrating a memory system including a data buffer according to an embodiment of the present disclosure.

FIG. 6 is a diagram illustrating a memory system 2100 including a data buffer according to an embodiment of the present disclosure, for example, the data buffer 1000 of FIG. 1.

Referring to FIG. 6, an electronic system 10000 may include the memory system 2100 for storing data and a host 2200 for controlling the memory system 2100.

The memory system 2100 may include a memory device 2110 for storing data, a buffer memory 2130 for temporarily storing data necessary for an operation of the memory system 2100, and a memory controller 2120 for controlling the memory device 2110 and the buffer memory 2130 under the control of the host 2200.

The host 2200 may communicate with the memory system 2100, using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The memory device 2110 may store data under the control of the memory controller 2120 or transmit stored data to the memory controller 2120. For example, the memory device 2110 may input and output data in various modes under the control of the memory controller 2120. Therefore, the above-described data transmission circuit 1100 in the data buffer 1000 may be included in the memory device 2110. In some embodiments, the data transmission circuit 1100 may also be included in the memory controller 2120 or the buffer memory 2130.

The memory controller 2120 may control the overall operations of the memory system 2100, and control data exchange between the host 2200 and the memory device 2110. For example, the memory controller 2120 may program or read data by controlling the memory device 2110 in response to a request from the host 2200. Also, the memory controller 2120 may store information of main memory blocks and sub-memory blocks, which are included in the memory device 2110, and select the memory device 2110 to perform a program operation on a main memory block or a sub-memory block according to the amount of data loaded for the program operation. Also, the memory controller 2120 may temporarily store system data for controlling the memory device 2110 in the buffer memory 2130.

The buffer memory 2130 may be used as a working memory, cache memory or buffer memory of the memory controller 2120. The buffer memory 2130 may store codes and commands executed by the memory controller 2120. Also, the buffer memory 2130 may store data processed by the memory controller 2120. In addition, the memory controller 2120 may receive data and a logical address from the host 2200, and translate the logical address into a physical address indicating an area in which data in the memory device 2110 is to be actually stored. Also, the memory controller 2120 may store, in the buffer memory 2130, a logical-to-physical address mapping table that establishes a mapping relationship between the logical address and the physical address.

In some embodiments, the buffer memory 2130 may include a Double Data Rate Synchronous Dynamic Random Access Memory (DDR SDRAM), a Low Power Double Data Rate 4 (LPDDR4) SDRAM, a Graphics Double Data Rate (GDDR) SDRAM, a Low Power DDR (LPDDR), a Rambus Dynamic Random Access Memory (RDRAM), or the like.

The memory device 2110 may be implemented with a flash memory, and communicate with the memory controller 2120 through a channel.

Figure 7:
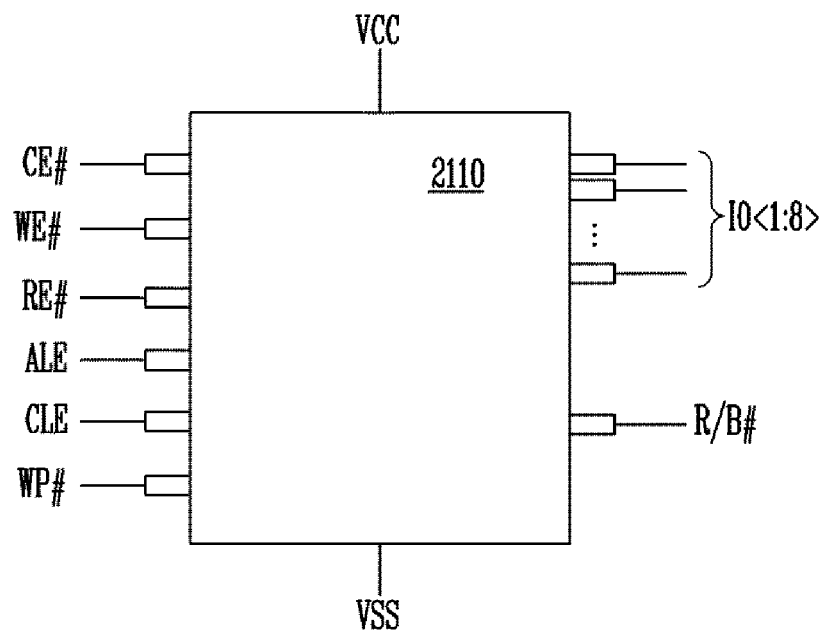
FIG. 7 is a diagram illustrating pads of a memory device according to an embodiment of the present disclosure.

FIG. 7 is a diagram illustrating pads of a memory device according to an embodiment of the present disclosure, for example, the memory device 2110 of FIG. 6.

Referring to FIG. 7, the memory device 2110 may be supplied with a power voltage VCC and be coupled to a ground terminal VSS. The memory device 2110 may be coupled to the memory controller 2120 of FIG. 6 through a plurality of pads or terminals. For example, a plurality of lines included in a channel may be coupled to the pads of the memory device 2110.

A CE# pad is a pad to which a chip enable signal is applied. When the memory device 2110 is in a ready state, the CE# pad may be used to allow the selected memory device 2110 to enter into a standby mode.

A WE# pad is a pad to which a write enable signal is applied, and may be used when data or a command is input.

An RE# pad is a pad to which a read enable signal is applied, and may be used when data is output.

An ALE pad is a pad to which an address latch enable signal is applied, and may be used to control loading of an address into the memory device 2110. For example, when a high address latch enable signal is applied to the ALE pad, an address may be loaded into the memory device 2110.

A CLE pad is a pad to which a command latch enable signal is applied, and may be used when a command is loaded into the memory device 2110. For example, when a high command latch enable signal is applied to the CLE pad in a wake-up operation, the memory controller 2120 may transmit a status check command to the memory device 2110.

A WP# pad is a terminal to which a write protect signal is applied, and may be used to protect the memory device when a program operation or erase operation is accidentally performed.

The IO pad may be used to transmit a command, an address, and data. For example, eight IO pads IO<1:8> may be included in the memory device 2110.

An R/B# pad may be a pad to which a status signal output from the memory device 2110 is transmitted in response to the status check command. The R/B# pad may be omitted, in which case the IO pad may be used as the R/B# pad.

Figure 8:
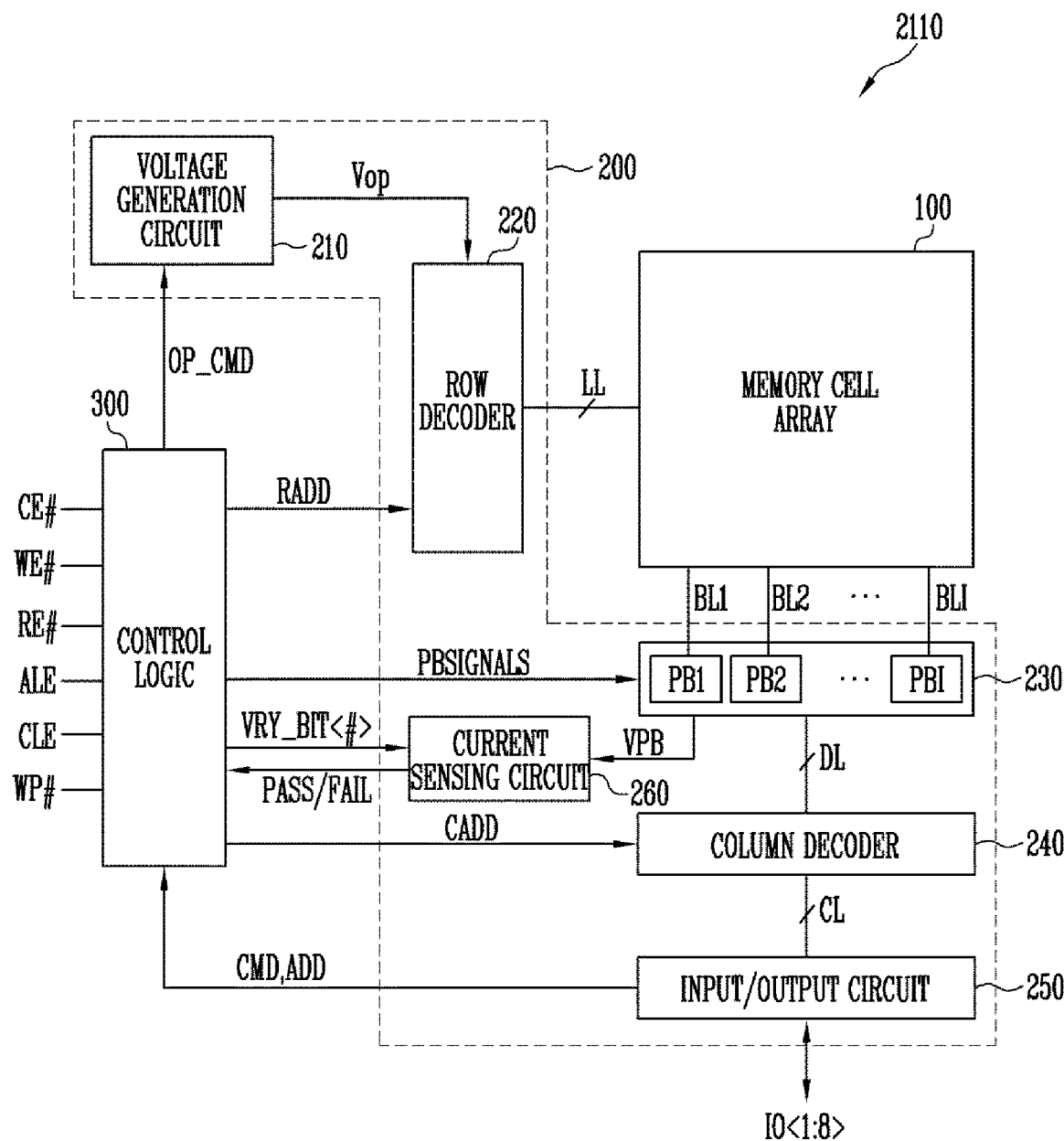
FIG. 8 is a diagram illustrating detail of a memory device according to an embodiment of the present disclosure.

FIG. 8 is a diagram illustrating a memory device according to an embodiment of the present disclosure, for example, the memory device 2110 of FIG. 7.

Referring to FIG. 8, the memory device 2110 may include a memory cell array 100 that stores data. The memory device 2110 may include a peripheral circuit 200 configured to perform a program operation for storing data in the memory cell array 100, a read operation for outputting the stored data, and an erase operation for erasing the stored data. The memory device 2110 may include control logic 300 that controls the peripheral circuit 200 under the control of the memory controller 2120 of FIG. 6.

The memory cell array 100 may include a plurality of memory blocks. User data and various information necessary for an operation of the memory device 2110 may be stored in the memory blocks. The memory blocks may be implemented in a two-dimensional (2D) or three-dimensional (3D) structure. Recently, memory blocks have been mainly implemented in the 3D structure so as to improve the degree of integration. Memory blocks having the 2D structure may include memory cells arranged in parallel to a substrate, and memory blocks having the three-dimensional structure may include memory cells stacked vertically to a substrate.

The peripheral circuit 200 may be configured to perform program, read, and erase operations under the control of the control logic 300. For example, the peripheral circuit 200 may include a voltage generation circuit 210, a row decoder 220, a page buffer group 230, a column decoder 240, an input and output (input/output) circuit 250, and a current sensing circuit 260.

The voltage generation circuit 210 may generate various operating voltages Vop used for program, read, and erase operations in response to an operation signal OP_CMD. For example, the voltage generation circuit 210 may generate a program voltage, a verify voltage, a pass voltage, a compensation program voltage, a read voltage, an erase voltage, a turn-on voltage, and the like under the control of the control logic 300.

The row decoder 220 may transfer the operating voltages Vop to local lines LL coupled to a selected memory block among the memory blocks of the memory cell array 100 in response to a row address RADD. The local lines LL may include local word lines, local drain select lines, and local source select lines. In addition, the local lines LL may include various lines, such as a source line, which are coupled to the memory block.

The page buffer group 230 may be coupled to bit lines BL1 to BLI coupled to the memory blocks of the memory cell array 100. The page buffer group 230 may include a plurality of page buffers PB1 to PBI coupled to the bit lines BL1 to BLI. The page buffers PB1 to PBI may operate in response to page buffer control signals PBSIGNALS. For example, the page buffers PB1 to PBI may temporarily store data received through the bit lines BL1 to BLI, or sense voltages or currents of the bit lines BL1 to BLI in a read or verify operation. Each of the page buffers PB1 to PBI may include a plurality of latches capable of temporarily storing data. For example, each of the page buffers PB1 to PBI may include at least three latches so as to perform a cache read operation.

The column decoder 240 may transfer data between the input/output circuit 250 and the page buffer group 230 in response to a column address CADD. For example, the column decoder 240 may exchange data with the page buffers PB1 to PBI through data lines DL, or exchange data with the input/output circuit 250 through column lines CL.

The input/output circuit 250 may transfer a command CMD and an address ADD, which are received from an external device, for example, the memory controller 2120 of FIG. 6, to the control logic 300, or exchange data DATA with the column decoder 240. For example, when a debugging command, an address, and debugging information are received from the memory controller 2120, the input/output circuit 250 may transmit the debugging command and the address to the control logic 300, and transmit the debugging information to the column decoder 240. The above-described data buffer 1000 of FIGS. 1 to 5 may be included in the input/output circuit 250.

In a read operation or a verify operation, the current sensing circuit 260 may generate a reference current in response to a permission bit VRY_BIT<#>, and output a pass signal PASS or a fail signal FAIL by comparing a sensing voltage VPB received from the page buffer group 230 with a reference voltage generated by the reference current.

The control logic 300 may receive the command CMD and the address ADD in response to signals received through the CE#, WE#, RE#, ALE, CLE, and WP# pads. The control logic 300 may control the peripheral circuit 200 by outputting the operation signal OP_CMD, the row address RADD, the page buffer control signals PBSIGNALS, and the permission bit VRY_BIT<#> in response to the command CMD and the address ADD. Also, the control logic 300 may determine whether the verify operation has passed or failed in response to the pass or fail signal PASS or FAIL.

Figure 9:
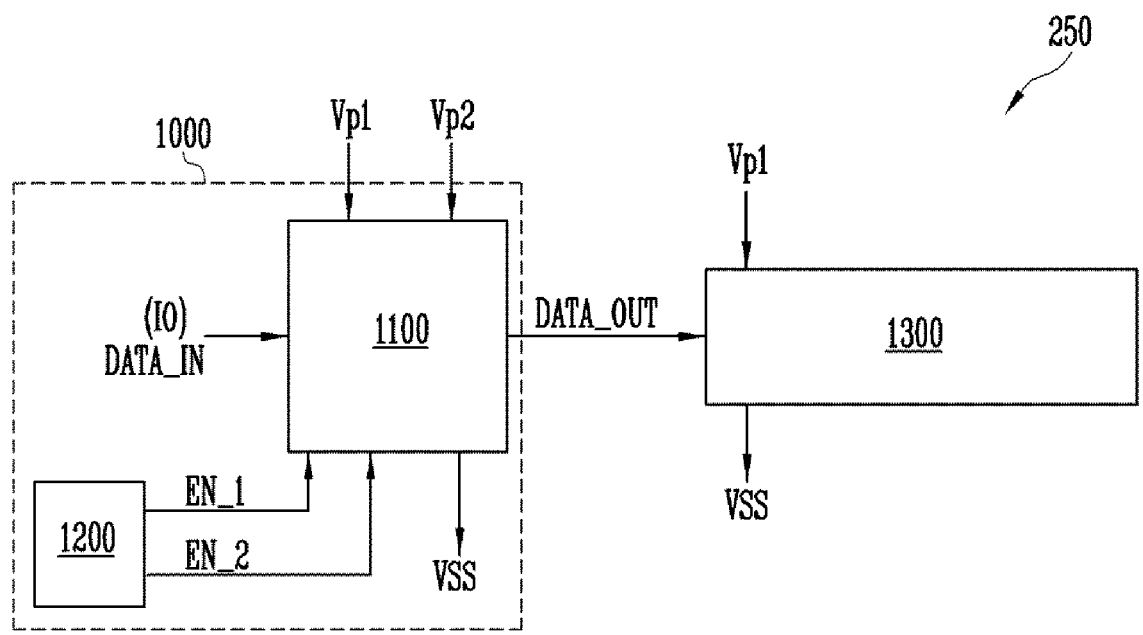
FIG. 9 is a diagram illustrating an input/output circuit according to an embodiment of the present disclosure.

FIG. 9 is a diagram illustrating an input/output circuit according to an embodiment of the present disclosure, for example, the input/output circuit 250 of FIG. 8.

Referring to FIG. 9, the input/output circuit 250 may include a data buffer, for example, the data buffer 1000 of FIG. 1.

The data buffer 1000 may include a data transmission circuit 1100 and a mode switching circuit 1200 as described above. The mode switching circuit 1200 may output the first or second enable signal EN_1 or EN_2 according to a mode in which the memory device 2110 operates. The data transmission circuit 1100 may output the output data DATA_OUT by amplifying the input data DATA_IN received through the IO in response to the first or second enable signal EN_1 or EN_2. The configuration and operating method of the data transmission circuit 1100 have been described in FIGS. 3 to 5, and therefore, will not be described again.

The input/output circuit 250 may further include a delay buffer 1300 for delaying the output data DATA_OUT output from the data transmission circuit 1100. The delay buffer 1300 may be supplied with the first voltage Vp1 and be coupled to the ground voltage terminal.

Figure 10:
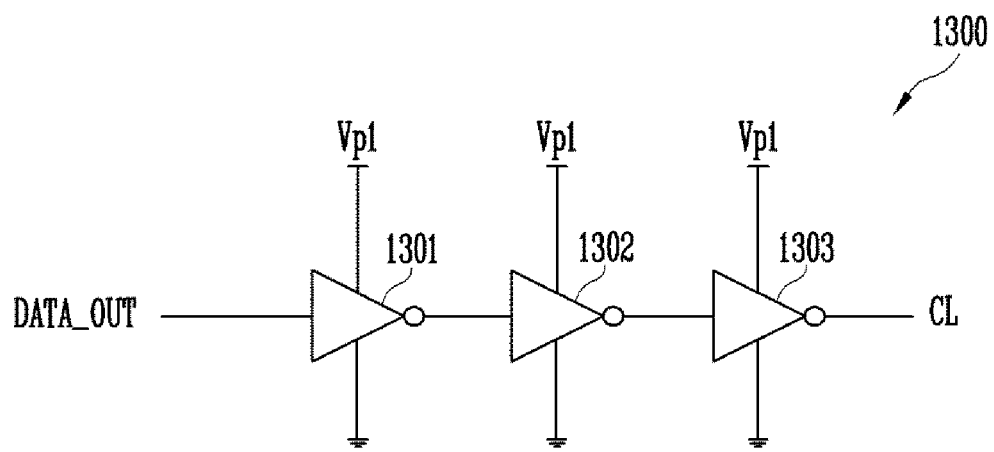
FIG. 10 is a circuit diagram illustrating a delay buffer according to an embodiment of the present disclosure.

FIG. 10 is a circuit diagram illustrating a delay buffer according to an embodiment of the present disclosure, for example, the delay buffer 1300 of FIG. 9.

Referring to FIG. 10, the delay buffer 1300 may include a plurality of inverters 1301 to 1303. For example, each of the inverters 1301 to 1303 may be formed in the same structure as the data transmission circuit 1100, or be used to have an inverter structure generally used. The data transmission circuit 1100 may output the output data DATA_OUT by inverting the input data DATA_IN. Therefore, inverters 1301 to 1303 of which number is odd may be included in the delay buffer 1300. For example, when the output data DATA_OUT output from the data transmission circuit 1100 is high, the inverters 1301 to 1303 may be configured such that low level data is finally transmitted to the column lines CL. When the output data DATA_OUT output from the data transmission circuit 1100 is low, the inverters 1301 to 1303 may be configured such that high level data is finally transmitted to the column lines CL.

Figure 11:
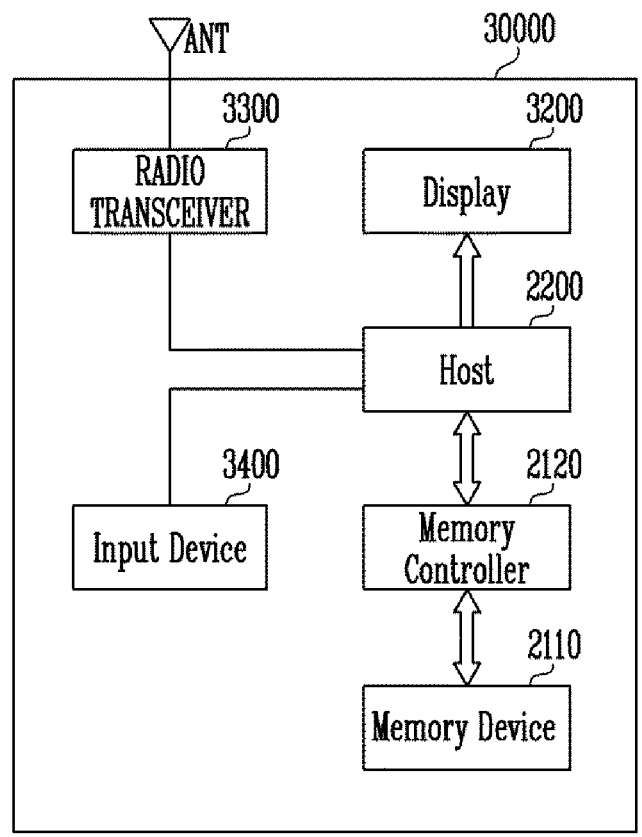
FIG. 11 is a diagram illustrating a memory system according to another embodiment of the present disclosure.

FIG. 11 is a diagram illustrating a memory system according to another embodiment of the present disclosure, the memory system including the memory device 2110 and the memory controller 2120 shown in FIG. 6.

Referring to FIG. 11, the memory system 30000 may be implemented as a cellular phone, a smart phone, a tablet PC, a personal digital assistant (PDA), or a wireless communication device.

The memory system 30000 may include the memory device 2110 and the memory controller 2120 capable of controlling an operation of the memory device 2110. The memory controller 2120 may control a data access operation of the memory device 2110, e.g., a program operation, an erase operation, a read operation, or the like under the control of a host 2200.

Data programmed in the memory device 2110 may be output through a display 3200 under the control of the memory controller 2120.

A radio transceiver 3300 may transmit and receive radio signals through an antenna ANT. For example, the radio transceiver 3300 may convert a radio signal received through the antenna ANT into a signal that can be processed by the host 2200. Therefore, the host 2200 may process a signal output from the radio transceiver 3300 and transmit the processed signal to the memory controller 2120 or the display 3200. The memory controller 2120 may transmit the signal processed by the host 2200 to the memory device 2110. Also, the radio transceiver 3300 may convert a signal output from the host 2200 into a radio signal, and output the converted radio signal to an external device through the antenna ANT. An input device 3400 is capable of inputting a control signal for controlling an operation of the host 2200 or data to be processed by the host 2200, and may be implemented as a pointing device such as a touch pad or a computer mount, a keypad, or a keyboard. The host 2200 may control an operation of the display 3200 such that data output from the memory controller 2120, data output from the radio transceiver 3300, or data output from the input device 3400 may be output through the display 3200.

Figure 12:
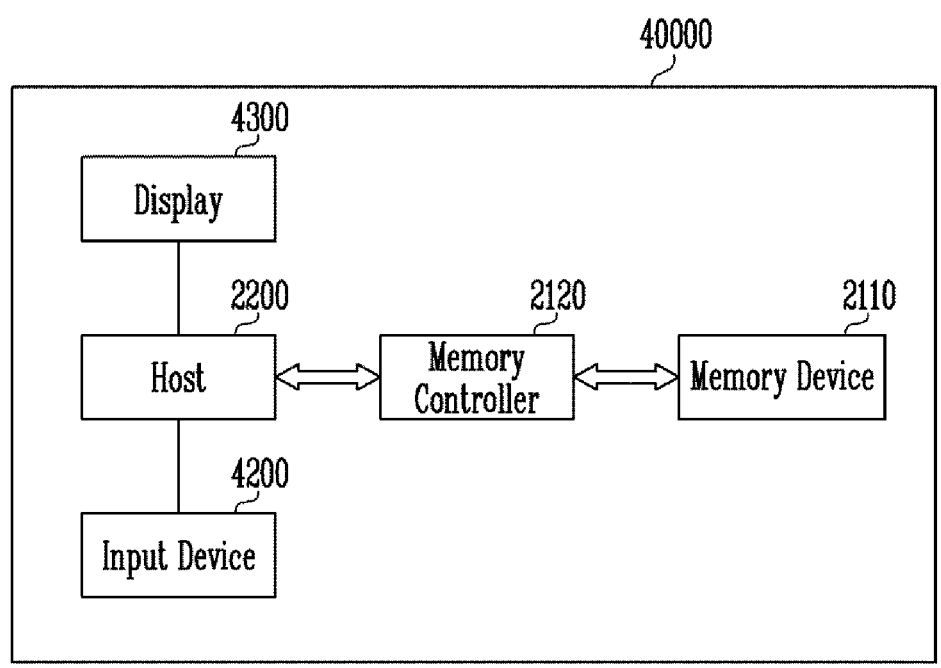
FIG. 12 is a diagram illustrating a memory system according to another embodiment of the present disclosure.

FIG. 12 is a diagram illustrating a memory system according to another embodiment of the present disclosure, for example, the memory system including the memory device 2110 and the memory controller 2120 shown in FIG. 6.

Referring to FIG. 12, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 2110 and the memory controller 2120 capable of controlling a data processing operation of the memory device 2110.

A host 2200 may output data stored in the memory device 2110 through a display 4300 according to data input through an input device 4200. For example, the input device 4200 may be implemented as a pointing device such as a touch pad or a computer mouse, a keypad, or a keyboard.

The host 2200 may control overall operations of the memory system 40000, and control an operation of the memory controller 2120.

Figure 13:
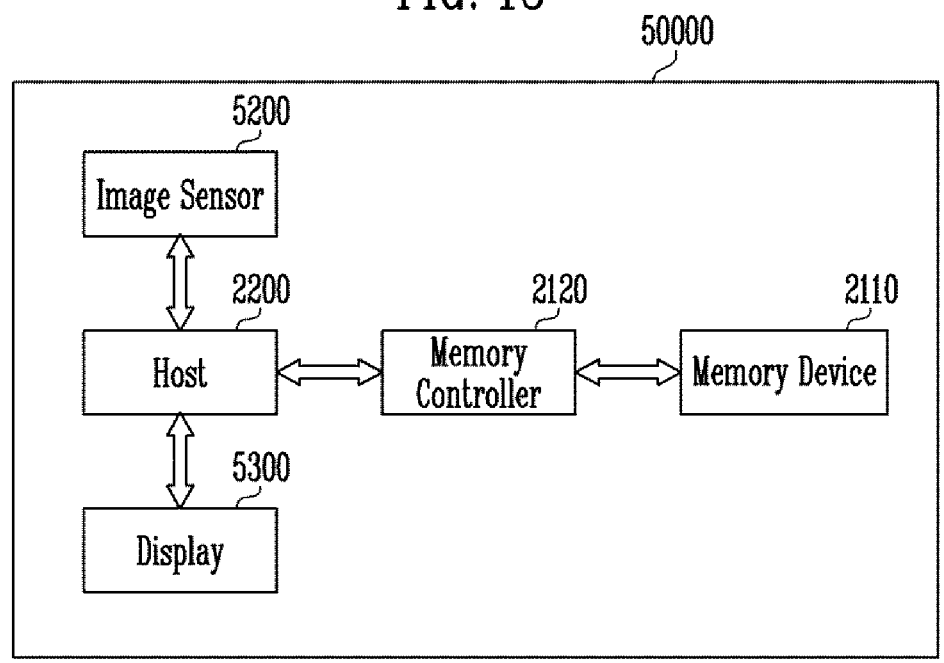
FIG. 13 is a diagram illustrating a memory system according to another embodiment of the present disclosure.

FIG. 13 is a diagram illustrating a memory system according to another embodiment of the present disclosure, for example, the memory system including the memory device 2110 and the memory controller 2120 shown in FIG. 6.

Referring to FIG. 13, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include the memory device 2110 and the memory controller 2120 capable of controlling a data processing operation of the memory device 2110, e.g., a program operation, an erase operation, or a read operation.

An image sensor 5200 of the memory system 50000 may convert an optical image into digital signals, and the converted digital signals may be transmitted to a host 2200 or the memory controller 2120. Under the control of the host 2200, the converted digital signals may be output through a display 5300, or be stored in the memory device 2110 through the memory controller 2120. In addition, data stored in the memory device 2110 may be output through the display 5300 under the control of the host 2200.

Figure 14:
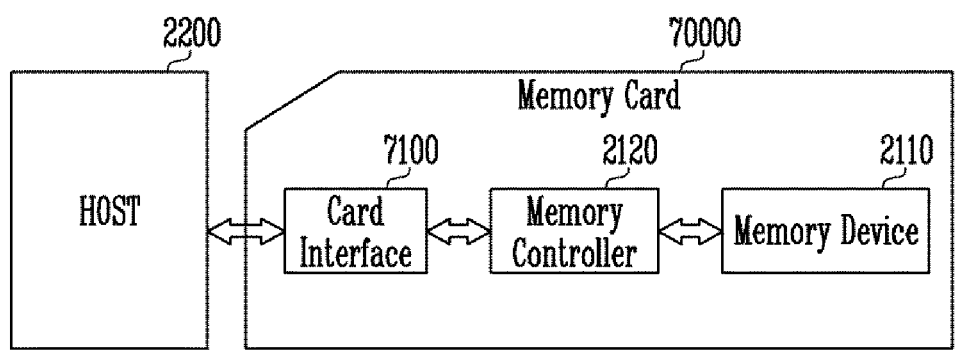
FIG. 14 is a diagram illustrating a memory system according to another embodiment of the present disclosure.

FIG. 14 is a diagram illustrating a memory system according to another embodiment of the present disclosure, for example, the memory system including the memory device 2110 and the memory controller 2120 shown in FIG. 6.

Referring to FIG. 14, the memory system may include a host 2200 and a memory card 70000.

The memory card 70000 may be implemented with a smart card. The memory card 70000 may include the memory device 2110, the memory controller 2120, and a card interface 7100.

The memory controller 2120 may control data exchange between the memory device 2110 and the card interface 7100. In some embodiments, the card interface 7100 may be a Secure Digital (SD) card interface or a Multi-Media Card (MMC) interface, but the present disclosure is not limited thereto. Also, the card interface 7100 may interface data exchange between the host 2200 and the memory controller 2120 according to a protocol of the host 2200. In some embodiments, the card interface 7100 may support a Universal Serial Bus (USB) protocol and an Inter-Chip (IC)-USB protocol. The card interface 7100 may mean hardware capable of supporting a protocol used by the host 2200, software embedded in the hardware, or a signal transmission scheme.

According to embodiments of the present disclosure, modes may be switched based on data having different swing levels, using one data buffer. Accordingly, data having different swing levels may be transmitted without increasing the number of data buffers.

Various embodiments have been disclosed herein, and although specific terms are employed, they are used and are to be interpreted in a generic and descriptive sense and not for purpose of limitation. In some instances, as would be apparent to one skilled in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A data buffer comprising:
    a first amplifier configured to output data through an output node in response to input data having a first swing level in a first mode, and output data that is of a low level through the output node in response to the input data having a second swing level that is narrower than the first swing level in a second mode; and
    a second amplifier configured to output data through the output node in response to the input data having the first swing level in the first mode, and output data that is of a high level through the output node in response to the input data having the second swing level in the second mode.

2. The data buffer of claim 1, wherein the first amplifier includes:
    a first switch coupling, to the output node, a node to which a positive voltage is applied; and
    a second switch coupling the output node to a ground, based on the input data.

3. The data buffer of claim 2, wherein the first switch:
couples the node to which the positive voltage is applied and the output node in the first mode; and
blocks the node to which the positive voltage is applied from coupling the output node in the second mode.

4. The data buffer of claim 2, wherein the second switch couples the output node and the ground, based on the input data, in the first mode and the second mode.

5. The data buffer of claim 1, wherein the second amplifier includes:
a third switch coupling, to the output node, a node to which a positive voltage is applied, based on the input data; and
a fourth switch coupling the output node to the ground.

6. The data buffer of claim 5, wherein the third switch couples the node to which the positive voltage is applied and the output node, based on the input data, in the first mode and the second mode.

7. The data buffer of claim 5, wherein the fourth switch:
couples the output node and the ground in the first mode; and
blocks the output node and the ground from coupling in the second mode.

8. The data buffer of claim 1, further comprising a voltage selection circuit supplied with a first voltage, a second voltage, and a ground voltage, the voltage selection circuit configured to output the second voltage as first and second internal voltages in the first mode, the voltage selection circuit configured to output the first voltage as the first internal voltage and output the ground voltage as the second internal voltage in the second mode.

9. The data buffer of claim 8, wherein the voltage selection circuit includes:
a switch outputting the first voltage as the first internal voltage in the second mode;
a switch outputting the second voltage as the first internal voltage in the first mode;
a switch outputting the ground voltage as the second internal voltage in the second mode; and
a switch outputting the second voltage as the second internal voltage in the first mode.

10. The data buffer of claim 9, wherein the first amplifier selectively forms or blocks a current path at the output node to which the output data is output based on the second internal voltage, and
the second amplifier selectively forms or blocks a current path at the output node to which the output data is output based on the first internal voltage.

11. The data buffer of claim 10, wherein, in the first mode, the first amplifier and the second amplifier form a current path between the first voltage supplied to the first amplifier and the ground based on the second internal voltage and the first internal voltage.

12. The data buffer of claim 10, wherein in the second mode,
the first amplifier blocks a current path between the first voltage supplied to the first amplifier and the ground based on the second internal voltage, and
the second amplifier blocks a current path between the output node and the ground based on the first internal voltage.

13. A memory device comprising:
a memory cell array configured to store data;
a peripheral circuit configured to perform various operations of the memory cell array; and
control logic configured to control the peripheral circuit, based on a command, an address, and input data, which are received through a channel,
wherein the peripheral circuit includes a data buffer configured to transfer, within the peripheral circuit, data generated in different modes according to swing levels of the input data received through the channel, and
wherein the data buffer includes:
a first amplifier configured to output data in response to the input data having a first swing level in a first mode, and output data that is of a low level in response to the input data having a second swing level that is narrower than the first swing level in a second mode; and
a second amplifier configured to output data in response to the input data having the first swing level in the first mode, and output data that is of a high level in response to the input data having the second swing level in the second mode.

14. The memory device of claim 13, wherein the first amplifier and the second amplifier have coupled output nodes to which the output data is output, and
wherein the first amplifier and the second amplifier are activated to output the output data in response to a first enable signal or a second enable signal determined by the input data having the first swing level or the second swing level.

15. The memory device of claim 14, further comprising a delay buffer configured to invert the output data and transfer data obtained by inverting the output data within the peripheral circuit.

* * * * *